US009255736B2

(12) United States Patent
Yoshii et al.

(10) Patent No.: US 9,255,736 B2
(45) Date of Patent: Feb. 9, 2016

(54) VERTICAL-TYPE HEAT TREATMENT APPARATUS

(75) Inventors: Koji Yoshii, Oshu (JP); Tatsuya Yamaguchi, Sapporo (JP); Wenling Wang, Oshu (JP); Takanori Saito, Oshu (JP)

(73) Assignee: Tokyo Electron Limited, Minato-Ku (JP)

( * ) Notice: Subject to any disclaimer, the term of this patent is extended or adjusted under 35 U.S.C. 154(b) by 996 days.

(21) Appl. No.: 13/226,120

(22) Filed: Sep. 6, 2011

(65) Prior Publication Data

US 2012/0064472 A1 Mar. 15, 2012

(30) Foreign Application Priority Data

Sep. 9, 2010 (JP) ................................ 2010-201821

(51) Int. Cl.
*F27B 17/02* (2006.01)
*F27B 17/00* (2006.01)
*H01L 21/67* (2006.01)

(52) U.S. Cl.
CPC ...... *F27B 17/0025* (2013.01); *H01L 21/67109* (2013.01); *H01L 21/67248* (2013.01)

(58) Field of Classification Search
CPC .................................................. F27B 17/0025
USPC .................................. 432/42, 48, 95, 247, 49
See application file for complete search history.

(56) References Cited

U.S. PATENT DOCUMENTS

| | | | |
|---|---|---|---|
| 5,517,594 A | 5/1996 | Shah et al. | |
| 6,403,927 B1 * | 6/2002 | Kato | 219/390 |
| 7,432,475 B2 | 10/2008 | Nakajima et al. | |
| 2002/0045146 A1 * | 4/2002 | Wang | C23C 16/46 432/49 |
| 2002/0055080 A1 * | 5/2002 | Tanaka et al. | 432/49 |

(Continued)

FOREIGN PATENT DOCUMENTS

| | | |
|---|---|---|
| JP | 2002-305189 A1 | 10/2002 |
| JP | 2005-188869 A1 | 7/2005 |

(Continued)

OTHER PUBLICATIONS

Korean Office Action (Application No. 10-2011-90957) dated Sep. 5, 2014.

(Continued)

*Primary Examiner* — Alissa Tompkins
*Assistant Examiner* — John Bargero
(74) *Attorney, Agent, or Firm* — Burr & Brown, PLLC

(57) ABSTRACT

A heat treatment apparatus and control method enabling the apparatus to settle down an internal temperature of a treating vessel to a target temperature accurately and quickly. The heat treatment apparatus includes a furnace body with a heater on an inner circumferential surface thereof, the treating vessel disposed inside the furnace body, a cooling medium supply blower and cooling medium release blower each connected to the furnace body, and a temperature sensor provided inside the treating vessel. A signal from the temperature sensor is sent to a heater output computing unit and blower output computing unit included in a controller. The heater output computing unit determines a heater output level based on a heater output numerical model and the signal from the temperature sensor. The blower output computing unit determines a blower output level based on a blower output numerical model and the signal from the temperature sensor.

8 Claims, 6 Drawing Sheets

(56) References Cited

U.S. PATENT DOCUMENTS

2005/0280384 A1* 12/2005 Sulfstede .................. 318/432
2009/0029486 A1   1/2009 Ueno et al.

FOREIGN PATENT DOCUMENTS

JP    2009-158968 A1   7/2009
KR   10-2006-0107740 A1   10/2006
WO   2007/105431 A1   9/2007

OTHER PUBLICATIONS

Japanese Office Action (Application No. 2011-164133) dated Sep. 2, 2014.

Japanese Office Action, Japanese Application No. 2011-164133, dated Mar. 27, 2015 ( 3 pages).

* cited by examiner

VERTICAL-TYPE HEAT TREATMENT APPARATUS

CROSS-REFERENCE TO RELATED APPLICATIONS

This patent application benefits from Japanese Patent Application No, 2010-201821, filed on Sep. 9, 2010, the disclosure of which is hereby incorporated by reference in its entirety.

BACKGROUND OF THE INVENTION

1. Field of the Invention

The present invention relates to a vertical-type heat treatment apparatus.

2. Description of the Related Art

During the manufacture of semiconductor devices, various types of heat treatment apparatuses are used to conduct oxidizing, diffusing, chemical vapor deposition (CVD), annealing, and/or other heat treatment processes, upon materials to be heat-treated, such as semiconductor wafers. Among these apparatuses is known a vertical-type heat treatment apparatus capable of heat-treating a large number of sheets at a time. This conventional vertical-type heat treatment apparatus includes a quartz-made treating vessel having an opening in its lower portion, a lid for blocking/unblocking the opening in the treating vessel, a holder provided on the lid, for holding in a vertical direction at predetermined spatial intervals, a plurality of objects to be processed, and a furnace body surrounding the treating vessel and including a heater to heat the target materials after loading of the materials into the treating vessel.

JP-A-2002-305189, for example, proposes another vertical-type heat treatment apparatus, which is equipped with an air blower to forcibly air-cool a treating vessel by supplying air to the inside of a furnace body including a heater. The blower has been used for rapidly cooling wafers and the treating vessel after heat treatment.

Heat treatment processes include heat-treating wafers in a low-temperature region of, for example, 100 to 500° C., for a purpose such as forming a layer of a low dielectric constant. During the heat treatment in the low-temperature region, it becomes important how fast the furnace interior can be heated up or cooled down to a predetermined heat-treating temperature. An existing heat-treatment apparatus proposed for low-temperature applications includes a metallic treating chamber, not a quartz-made treating vessel, to obtain faster thermal response. However, if reaction products, by-products, or other substances are likely to stick to the furnace interior during the heat treatment, the use of a quartz-made treating vessel easier to clean and replace than a metallic treating chamber is necessary for reasons associated with the apparatus configuration. Additionally, although energy saving in the apparatus is achievable by using a heater having high heat-insulating performance, the use of the heater deteriorates the furnace in the controllability of internal temperature. In this case, it also becomes important how fast the furnace interior can be heated up or cooled down to a predetermined heat-treating temperature, and this issue also applies to temperatures other than those of the low-temperature region discussed above.

RELATED DOCUMENTS

Document 1: JP-A-2002-305189
Document 2: JP-A-2005-188869

SUMMARY OF THE INVENTION

The vertical-type heat treatment apparatus with a quartz-made treating vessel, however, has had a problem in that the settling time required for the furnace interior to recover from the heated state in the low-temperature region and settle down to a desired temperature tends to increase since the treating vessel has a large heat capacity. The same problem due to using a highly adiabatic heater for purposes such as energy saving, also occurs in temperature regions other than low-temperature regions. The above-discussed increase in settling time during the recovery from the heated state is influential upon the improvement of throughput. The problem of the increase in settling time occurs not only in the heating process, but also in a cooling process or under temperature stability.

The present invention has been made with the above problem taken into account, and an object of the invention is to provide a heat treatment apparatus and a method for controlling the apparatus, the apparatus being able to reduce a settling time required in a heating or cooling phase or stable temperature state during use of a heater in a low-temperature region or having high heat-insulating performance, and to settle down an internal temperature of a treating vessel to a target temperature very accurately.

A heat treatment apparatus according to a first aspect of the present invention includes: a furnace body; a heater provided on an inner circumferential surface of the furnace body; a treating vessel disposed inside the furnace body, the treating vessel forming a space between the furnace body and the vessel and internally accommodating a plurality of objects to be processed; a blower, connected to the furnace body via a cooling medium supply line, for supplying a cooling medium to the space formed between the furnace body and the treating vessel; an exhaust pipe connected to the furnace body; a furnace temperature sensor that detects internal temperature or external temperature of the treating vessel; and a controller that regulates the internal temperature of the treating vessel by controlling the heater and the blower in order to settle down the internal temperature of the treating vessel to a predetermined target temperature, wherein the controller includes: a numerical model relating to predetermined heater output and blower output levels; a heater output computing unit that determines a heater output level based on the numerical model and the furnace internal temperature detected by the furnace temperature sensor; and a blower output computing unit that determines a blower output level based on the numerical model and the furnace internal temperature detected by the furnace temperature sensor.

In the heat treatment apparatus according to the first aspect, the numerical model includes a heater output numerical model and a blower output numerical model, the heater output computing unit determines a heater output level based on the heater output numerical model and the furnace internal temperature from the furnace temperature sensor, and the blower output computing unit determines a blower output level based on the blower output numerical model and the furnace internal temperature from the furnace temperature sensor.

In the heat treatment apparatus according to the first aspect, the controller further includes a flow control computing unit that converts the blower output level, computed by the blower output computing unit, into a flow rate of the cooling medium.

In the heat treatment apparatus according to the first aspect, the flow control computing unit controls a rotating speed of the blower, based on the flow rate of the cooling medium.

In the heat treatment apparatus according to the first aspect, the exhaust pipe is provided with an exhaust temperature sensor, and the controller further includes an additional blower output computing unit that determines an additional blower output level appropriate for a preset temperature which follows the exhaust temperature from the exhaust temperature sensor, and an integrated blower output computing unit that combines the blower output level from the blower output computing unit and the additional blower output level from the additional blower output computing unit.

A heat treatment apparatus according to a second aspect of the present invention includes: a furnace body partitioned into a plurality of zones; heaters each provided on an inner circumferential surface of each zone of the furnace body; a treating vessel disposed inside the furnace body, the treating vessel forming a space between the furnace body and the vessel and internally accommodating a plurality of objects to be processed; blowers, each connected to each zone of the furnace body via a cooling medium supply line, for supplying a cooling medium to the space formed between the furnace body and the treating vessel; exhaust pipes each connected to each zone of the furnace body; furnace temperature sensors each provided at a position associated with each zone of the furnace body, each sensor detecting internal temperature or external temperature of the treating vessel; and a controller that regulates the internal temperature of the treating vessel by controlling the corresponding heater and blower for each zone of the furnace body in order to settle down the internal temperature of the treating vessel to a predetermined target temperature, wherein the controller includes: a numerical model for each zone of the furnace body, each numerical body relating to predetermined heater output and blower output levels; a heater output computing unit that determines a heater output level for each zone, based on the numerical model corresponding to the particular zone and the furnace internal temperature detected by the corresponding furnace temperature sensor; and a blower output computing unit that determines a blower output level in a particular zone, based on the numerical model corresponding to the particular zone and the furnace internal temperature detected by the corresponding furnace temperature sensor.

A heat treatment apparatus according to a third aspect of the present invention includes: a furnace body; a heater provided on an inner circumferential surface of the furnace body; a treating vessel disposed inside the furnace body, the treating vessel forming a space between the furnace body and the vessel and internally accommodating a plurality of objects to be processed; a blower, connected to the furnace body via a cooling medium supply line, for supplying a cooling medium to the space formed between the furnace body and the treating vessel; a valve mechanism that regulates a flow rate of the cooling medium supplied from the blower; an exhaust pipe connected to the furnace body; a furnace temperature sensor that detects internal temperature or external temperature of the treating vessel; and a controller that regulates the internal temperature of the treating vessel by controlling the heater and the valve mechanism in order to settle down the internal temperature of the treating vessel to a predetermined target temperature; wherein the controller includes: a numerical model relating to predetermined heater output and cooling output levels; a heater output computing unit that determines a heater output level based on the numerical model and the furnace internal temperature detected by the furnace temperature sensor; a cooling output computing unit that determines a cooling output level based on the numerical model and the furnace internal temperature detected by the furnace temperature sensor; and a flow control computing unit that converts the cooling output level determined by the cooling output computing unit, into the flow rate of the cooling medium, the flow control computing unit controlling the valve mechanism in accordance with the cooling medium flow rate.

In the heat treatment apparatus according to the third aspect, the numerical model includes a heater output numerical model and a cooling output numerical model, the heater output computing unit determines a heater output level based on the heater output numerical model and the furnace internal temperature from the furnace temperature sensor, and the cooling output computing unit determines a cooling output level based on the cooling output numerical model and the furnace internal temperature from the furnace temperature sensor.

A heat treatment apparatus according to a fourth aspect of the present invention includes: a furnace body partitioned into a plurality of zones; heaters each provided on an inner circumferential surface of each zone of the furnace body; a treating vessel disposed inside the furnace body, the treating vessel forming a space between the furnace body and the vessel and internally accommodating a plurality of objects to be processed; blowers, each connected to each zone of the furnace body via a cooling medium supply line, for supplying a cooling medium to the space formed between the furnace body and the treating vessel; a valve mechanism that regulates a flow rate of the cooling medium supplied from each blower; exhaust pipes each connected to each zone of the furnace body; furnace temperature sensors each provided at a position associated with each zone of the furnace body, each sensor detecting internal temperature or external temperature of the treating vessel; and a controller that regulates the internal temperature of the treating vessel by controlling the corresponding heater and valve mechanism for each zone of the furnace in order to settle down the internal temperature of the treating vessel to a predetermined target temperature, wherein the controller includes: a numerical model for each zone of the furnace body, each numerical model relating to predetermined heater output and cooling output levels; a heater output computing unit that determines a heater output level for each zone, based on the numerical model corresponding to the particular zone and the furnace internal temperature detected by the corresponding furnace temperature sensor; a cooling output computing unit for each zone that determines a cooling output level in a particular zone, based on the numerical model corresponding to the particular zone and the furnace internal temperature detected by the corresponding furnace temperature sensor; and a flow control computing unit that converts the cooling output level determined by the cooling output computing unit, into the flow rate of the cooling medium, the flow control computing unit controlling the valve mechanism corresponding to the particular zone in accordance with the cooling medium flow rate.

The present invention can reduce a cooling-down time during the heating phase, cooling phase, or stabilized temperature state in a low-temperature range, settle down the internal temperature of the treating vessel to the target temperature very accurately, and thus improve throughput. Alternatively, in the present invention, when a heater having high heat-insulating performance is used, electric power consumption can be reduced without an impact upon throughput.

DETAILED DESCRIPTION OF THE INVENTION

First Embodiment

Figure 1:
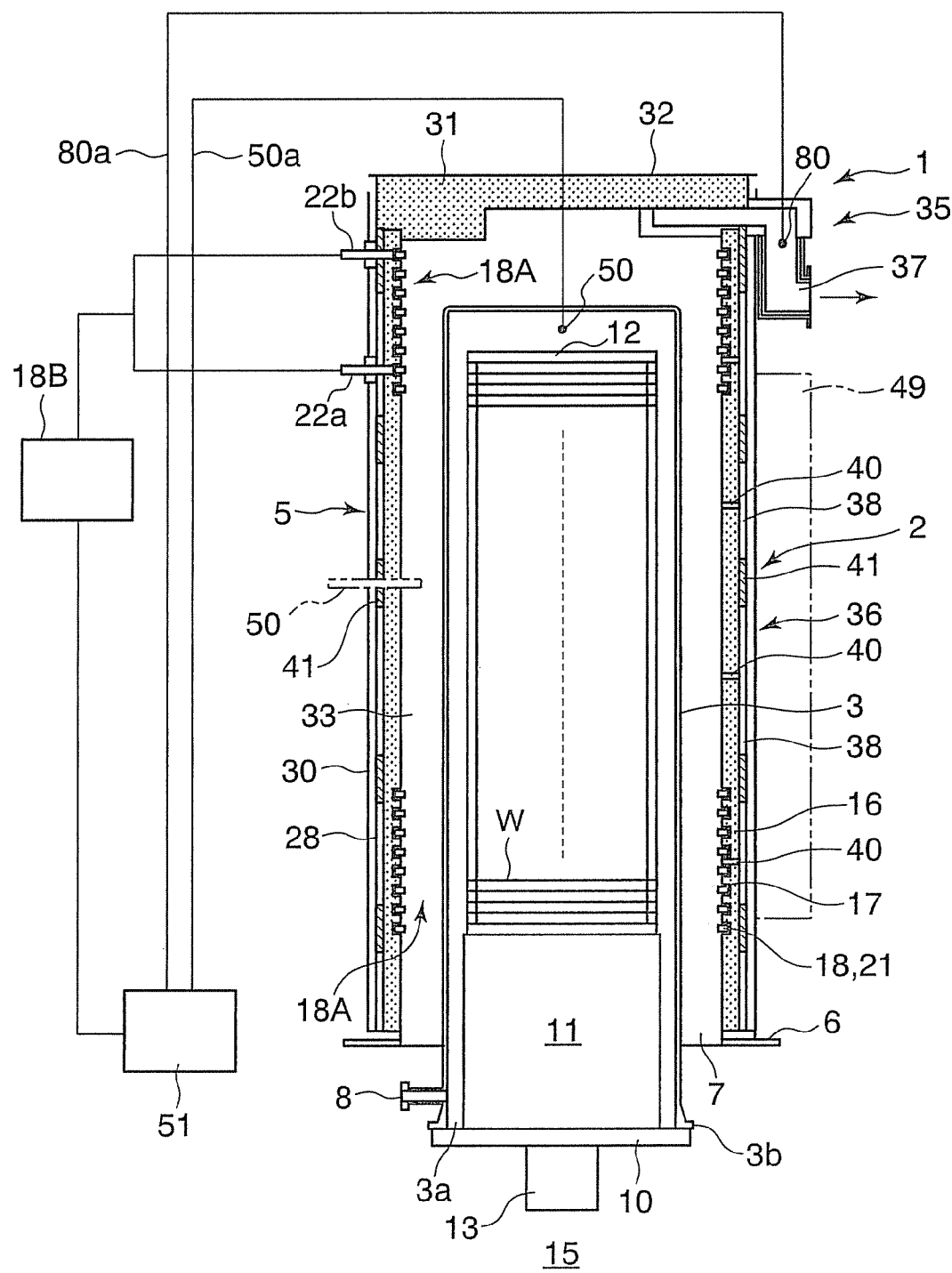
FIG. 1 is a longitudinal cross-sectional view schematically showing a first embodiment of a heat treatment apparatus according to the present invention.
Figure 2:
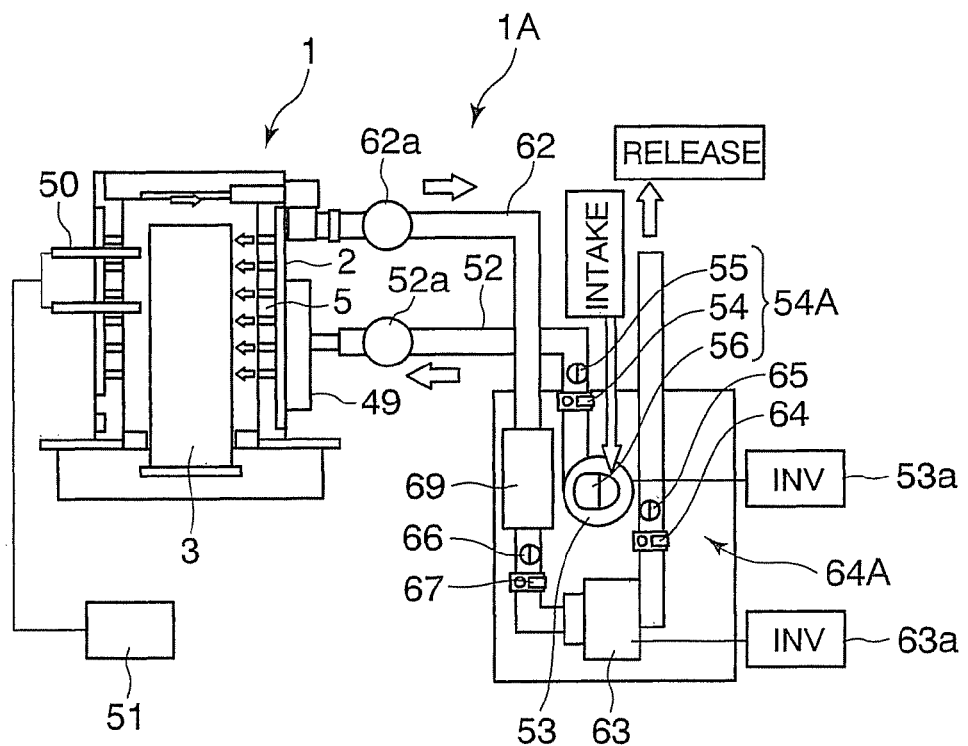
FIG. 2 is a diagram showing a cooling medium supply line and cooling medium release line of the heat treatment apparatus.
Figure 3:
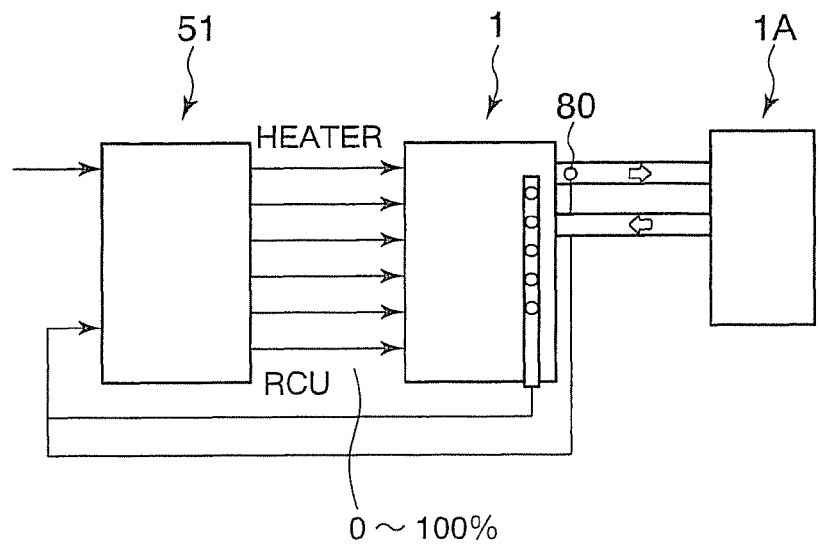
FIG. 3 is a schematic view showing a control method for the heat treatment apparatus.
Figure 4:
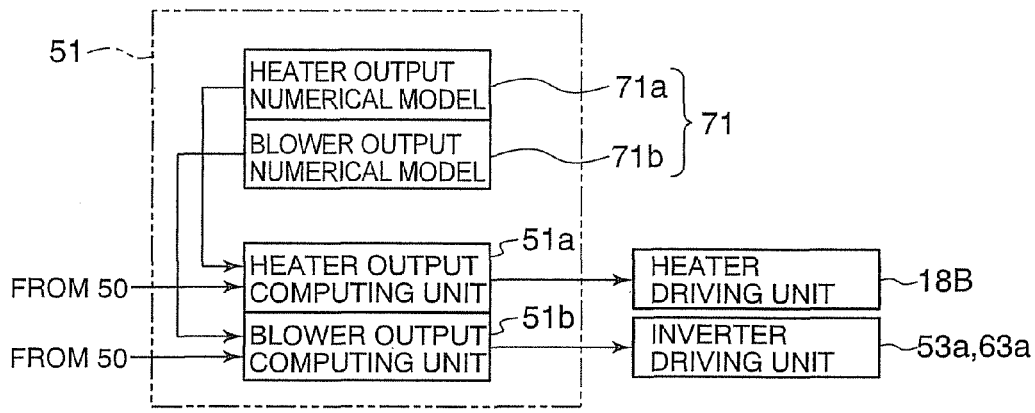
FIG. 4 is a schematic view showing a controller of the heat treatment apparatus.

A first embodiment of the present invention is described below referring to part of the accompanying drawings. FIG. 1 is a longitudinal cross-sectional view schematically showing a heat treatment apparatus according to the present invention, and FIG. 2 is a diagram showing a cooling medium supply line and cooling medium release line of the heat treatment apparatus. In addition, FIG. 3 is a schematic view showing a control method for the heat treatment apparatus, and FIG. 4 is a schematic view showing a controller of the heat treatment apparatus.

The vertical type of heat treatment apparatus 1 in FIG. 1 includes a vertical type of heat treatment furnace 2 that is able to accommodate a large number of objects to be processed, for example, semiconductor wafers W, at a time and to provide each wafer W with heat treatment processes such as oxidizing, diffusing, and/or chemical vapor deposition (CVD) under reduced pressure. The heat treatment furnace 2 includes a furnace body 5 having a resistance heating element (heater) 18A on its inner circumferential surface, and a treating vessel 3 disposed inside the furnace body 5, the treating vessel forming a space between the furnace body 5 and the vessel itself, internally accommodating the wafer W and heat-treating it. The heater 18A is formed by a plurality of heater elements 18, as described later herein.

The furnace body 5 is supported by a base plate 6, in which is formed an opening 7 for inserting the treating vessel 3 from below, in an upward direction. The opening 7 in the base plate 6 includes a heat-insulating material (not shown) for filling up or shrouding a clearance between the base plate 6 and the treating vessel 3.

The treating vessel 3, made of quartz, has a vertically elongated cylindrical shape with a blocked upper end and an opened lower end serving as an opening 3a. At the lower end of the treating vessel 3, an outward-facing flange 3b is formed, which is supported by the base plate 6 via a flange retainer not shown. An induction port 8 for inducting a process gas, an inert gas, and/or the like, into the vessel 3, and an exhaust port (not shown) for releasing the gas or gases from the treating vessel 3 are further provided on a lower section of the treating vessel 3. The induction port 8 is connected to a gas supply (not shown), and the exhaust port is connected to an exhaust system (not shown) that includes a vacuum pump having a pressure reduction control capability to obtain a vacuum pressure ranging, for example, nearly between 133× 600 Pa and $133 \times 10^{-2}$ Pa.

Below the treating vessel 3, a lid 10 for blocking the opening 3a of the vessel 3 is provided to be vertically movable by a lift not shown. On an upper section of the lid 10, a cylindrical heat-insulating body 11 as a heat insulator for the opening is mounted, and on an upper section of the cylindrical heat-insulating body 11, a quartz-made boat 12 is mounted as a wafer retainer in which to mount a large number of, for example, about 100 to 150 wafers with a 300-mm diameter vertically at predetermined intervals. A rotating mechanism 13 that rotates the boat 12 about an axial center of the boat is provided on the lid 10. The boat 12 is unloaded from the treating vessel 3 into a loading area 15 provided below, by a downward movement of the lid 10, and after wafer transfer, the boat 12 is loaded into the treating vessel 3 by an upward movement of the lid 10.

The furnace body 5 has a cylindrical heat-insulating material 16 and a shelf 17 of a multiple-tier grooved structure formed axially (in the example of FIG. 1, vertically) on an inner circumferential surface of the heat-insulating material 16, and the heater elements (resistance heating elements) 18 are arranged along the shelf 17. The heat-insulating material 16 is formed from inorganic fibers including, for example, silica, alumina, or aluminum silicate. The heat-insulating material 16 is divided into two sections vertically, thus making it easy to mount the heater elements and to assemble the heater.

The heat-insulating material 16 has pins (not shown) holding the heater elements 18 so that the heater elements 18 is movable in a radial direction at appropriate spatial intervals and prevented from falling from or sliding out of position in the shelf 17. On the inner circumferential surface of the cylindrical heat-insulating material 16, ring-like grooves 21 concentric with the particular inner circumferential surface are formed axially in multi-tier form at predetermined pitches, and the ring-shaped shelf 17 continuous in a circumferential direction is formed between mutually adjacent upper and lower grooves 21. Clearances dimensionally sufficient to permit thermal expansion/contraction and radial movement of the heater element 18 are present between upper and lower sections of each heater element 18 in the grooves 21, a rear wall of each groove 21, and the heater element 18. These clearances also allow a cooling medium to flow around to the rear of the heater element 18 during forced cooling to effectively cool the element 18. Air, a nitrogen gas, or water is useable as the cooling medium.

Each heater element 18 is interconnected by a connecting plate, the heater elements 18 positioned in one end of the furnace 2 are further connected to an external heater-driving unit 18B via terminal strips 22a or 22b provided so as to penetrate the heat-insulating material 16 in its radial direction.

As shown in FIG. 1, the heat-insulating material 16 has an outer circumferential surface shrouded by a metallic, for example, stainless steel outer shell 28, to retain a shape of the heat-insulating material 16 in the furnace body 5 and to strengthen the heat-insulating material 16. Additionally, the outer shell 28 has an outer circumferential surface shrouded by a water-cooling jacket 30 to suppress thermal impacts upon the outside of the furnace body 5. The heat-insulating material 16 further has a top shrouded with an upper heat-insulating material 31, over which a top plate 32 made of stainless steel is further provided to shroud a top (upper end) of the outer shell 28.

As shown in FIGS. 1 and 2, in order to expedite the heat treatment or improve throughput by rapidly cooling down the wafers after the heat treatment, the furnace body 5 further includes a heat release system 35 and forced-cooling medium means 36. The heat release system 35 releases an internal atmosphere of the space 33 between the furnace body 5 and the treating vessel 3 to the outside, and the forced-cooling medium means 36 introduces the cooling medium of a normal temperature (20 to 30° C.) into the space 33 and forcibly cools the furnace interior. The heat release system 35 includes a heat release port 37 provided, for example, at an upper section of the furnace body 5, and a cooling medium release line 62 for releasing the cooling medium from the space 33 is connected to the heat release port 37.

Furthermore, the forced-cooling medium means 36 includes a plurality of ring-shaped passageways 38 formed vertically between the heat-insulating material 16 and outer shell 28 of the furnace body 5, and cooling medium blowoff holes 40 provided in the heat-insulating material 16. The cooling medium blowoff holes 40 are constructed to blow off the cooling medium from each ring-shaped passageway 38, in an oblique direction from a central section of the heat-insulating material 16, and generate a swirling flow in a circumferential direction of the space 33. The ring-shaped passageway 38 is formed by, for example, affixing a band form or ring form of heat insulator 41 to an outer circumferential surface of the heat-insulating material 16 or circularly grinding away the outer circumferential surface of the heat-insulating material 16. The cooling medium blowoff holes 40 are formed in the shelf 17, with each groove of the shelf sandwiched between upper and lower adjacent heater elements 18 in the heat-insulating material 16, so as to extend through to the inside and outside of the shelf in its radial direction. In this way, the cooling medium blowoff holes 40 are provided in the shelf 17, so the cooling medium can be jetted towards the space 33 without being obstructed by each heater element 18.

While an example of using resistance heating elements of a band form as the heater elements 18 and accommodating these elements in the shelf 17 has been described, the heating elements 18 is not limited to the described structure and may be replaced by any one of various other heater element structures. In addition, although an example of generating a swirling flow in the space 33 by means of the cooling medium from the cooling medium blowoff holes 40 has been described, the cooling medium from the cooling medium blowoff holes 40 does not always need to be used to generate the swirling flow.

One common supply duct 49 for distributing the cooling medium to each ring-shaped passageway 38 is provided in a vertical direction along an outer circumferential surface of the outer shell 28. Ports for establishing communication between the supply duct 49 and each ring-shaped passageway 38 are also formed in the outer shell 28. A cooling medium supply line 52 that supplies the cooling medium is connected to the supply duct 49.

A temperature sensor (furnace temperature sensor) 50 that detects an internal temperature of the treating vessel 3 is disposed inside the vessel 3, and a detection signal from the temperature sensor 50 is sent to the controller 51 via a signal line 50a. The temperature sensor 50 does not absolutely need to be provided inside the treating vessel 3 and may instead be provided inside the space 33 between the furnace body 5 and the treating vessel 3 or inside both (two-dot chain line in FIG. 1).

A temperature sensor (exhaust temperature sensor) 80 is also mounted inside the heat release port 37, and a detection signal from the temperature sensor 80 is sent to the controller 51 via a signal line 80a.

As shown in FIGS. 1 and 2, the cooling medium supply line 52 and the cooling medium release line 62 each constitute an open cooling medium supply/release line independently. A flow sensor 52a and a cooling medium supply blower 53 are provided on the cooling medium supply line 52, and the cooling medium supply blower 53 includes an inverter driving unit 53a.

The cooling medium supply blower 53 has a damper 56 at its inlet side, and a hole valve 54 and a butterfly valve 55, at its outlet side. The damper 56 at the inlet side of the cooling medium supply blower 53, and the hole valve 54 and butterfly valve 55 at the outlet side are all adjustable in opening/closing angle position. The damper 56, the hole valve 54, and the butterfly valve 55 constitute a cooling-medium supply line valve mechanism 54A.

A flow sensor 62a and a cooling medium release blower 63 are provided on the cooling medium release line 62, and the cooling medium release blower 63 includes an inverter driving unit 63a.

The cooling medium release blower 63 has a butterfly valve 66 and a hole valve 67, at its inlet side, and a hole valve 64 and a butterfly valve 65, at its outlet side. The butterfly valve 66 and hole valve 67 at the inlet side of the cooling medium release blower 63, and the hole valve 64 and butterfly valve 65 at the outlet side are all adjustable in opening/closing angle position. The butterfly valve 66, the hole valve 67, the hole valve 64, and the butterfly valve 65 constitute a cooling-medium release line valve mechanism 64A.

The cooling medium supply blower 53, the cooling medium supply line 52, the cooling medium supply line valve mechanism 54A, the cooling medium release blower 63, the cooling medium release line 62, and the cooling medium release line valve mechanism 64A constitute a rapid cooling unit (RCU) system 1A.

Next, the controller 51 connected to the temperature sensor 50 is described in detail below.

As described above, the temperature sensor 50 is mounted inside the treating vessel 3 to detect the internal temperature of the vessel 3. However, the temperature sensor 50 may instead be mounted in the space 33 between the furnace body 5 and the treating vessel 3, to detect the internal temperature of the vessel 3 indirectly.

The detection signal from the temperature sensor 50 is sent to the controller 51 via the signal line 50a. The controller 51 reduces a time required for the apparatus to heat up or cool down the treating vessel interior to a predetermined target temperature accurately during heating or cooling or under temperature stability, in a low-temperature region of, for example, 100 to 500° C. FIG. 4 shows a diagram relating to heating/cooling control by the controller 51.

That is, the controller 51 includes a numerical model 71 relating to predefined heater output and blower output levels, a heater output computing unit 51a that determines a heater output level based on the numerical model 71 and the furnace internal temperature detected by the temperature sensor 50, and a blower output computing unit 51b that determines a blower output level based on the numerical model 71 and the furnace internal temperature detected by the temperature sensor 50.

The numerical model 71 includes a heater output numerical model 71a and a blower output numerical model 71b. The heater output computing unit 51a determines a heater output level based on the heater output numerical model 71a and the furnace internal temperature detected by the temperature sensor 50, and the blower output computing unit 51b determines a blower output level based on the blower output numerical model 71b and the furnace internal temperature detected by the temperature sensor 50.

The heater output numerical model 71a, part of the numerical model 71, is described below.

The heater output numerical model 71a is a mathematical model that can estimate temperature of semiconductor wafers W beforehand from the temperature sensor 50 and the heater driving unit 18B and identify electric power to be supplied to the heaters 18A to bring the estimated temperature, as a whole, close to a target temperature. The numerical model 71a can be any model of a multi-variable, multi-dimensional, or multi-output function type. More specifically, the model disclosed in U.S. Pat. No. 5,517,594, for example, can be used as the heater output numerical model 71a.

The description given below assumes the use of the model disclosed in U.S. Pat. No. 5,517,594. First, five test-use semiconductor wafers, each with thermocouples mounted centrally on the wafer and at a position 6 mm internally to its edge, are provided in the heat treatment apparatus shown in FIG. 1. Next, the five test-use semiconductor wafers and normal wafers are rested on a boat such that one test-use wafer is positioned in each of five zones. After this, the boat is loaded into the treating vessel. Next, a signal of a high-frequency band and that of a low-frequency band are applied to each heater to acquire temperature sensor output data, on-wafer thermocouple output data (wafer temperature data), heater supply current data, and more, at a sampling period of, for example, 1 to 5 seconds.

After the output data acquisition, temperature bands within a certain temperature range, for example, 400 to 1100° C., are set at intervals of 100° C. (this is to prevent temperatures from being estimated inaccurately if a wide temperature band is covered using one model). The acquired data is then used to establish an auto-regressive exogenous (ARX) model independently for each temperature band. The ARX model is shown in numerical expression 1.

$$y_t + AA_1 y_{t-1} + AA_2 y_{t-2} + \ldots + AA_n y_{t-n} = BB_1 u_{t-1} + BB_2 u_{t-2} + \ldots + BB_n u_{t-n} + e_t$$  [Numerical expression 1]

$y_t$: A vector of "p" rows, 1 column, with the following contents at point-in-time "t" as its components.

contents: a variation in the output state of a temperature sensor (since five temperature sensor thermocouples are present in this example, five components), a variation in the output state of the temperature sensor placed at a location different from that of the above (since five temperature sensors are present in this example, five components), a variation in the output state of each thermocouple set up centrally on the wafer (in this example, five components), and a variation in the output state of each thermocouple set up at the edge of the wafer (in this example, five components); in this example, therefore, $y_1$ denotes a vector of 20 rows, 1 column.

$u_t$: A vector of "m" rows, 1 column, taking as its components the variation in heater electric power at point-in-time "t" (since five heaters are present in this example, five rows, one column), $e_t$: A vector of "m" rows, 1 column, taking white noise as its component.

n: Delay (e.g., 8).

$AA_1$ to $AA_n$: Matrix of "p" rows, "p" columns (in this example, 20 rows, 20 columns).

$BB_1$ to $BB_n$: Matrix of "p" rows, "m" columns (in this example, 20 rows, 50 columns).

Coefficients $AA_1$ to $AA_n$ and $BB_1$ to $BB_n$ are determined using the method of least squares or the like.

The ARX model relationship, when applied to a state space method, will have its fundamental equation represented by numerical expression 2.

$$x_{t+1} = Ax_t + Bu_t + K_T e_t$$

$$y_t = Cx_{t+1} + e_t$$  [Numerical expression 2]

where "x" denotes a state variable, K denotes the feedback system of a Kalman filter, and A, B, C each denote a matrix.

In order to improve the treatment rate during actual film formation, the degree is made less dimensional to nearly the 10th order and numerical expression 2 is used to create a numerical model for each temperature band.

In this way, numerical expression 3 for determining the wafer temperature is derived from the inputs (the temperature sensor signals and the heater electric power P) for each temperature band.

$$\hat{x}_{t+1} = A\hat{x}_t + B(Pinput, t + ubias) + L(T\text{thermocouple}, t - C s\hat{x}_t + Sbias)$$

$$T\text{model}, t = Cw\hat{x}_t + Wbias$$  [Numerical expression 3]

The test-use wafers are next treated once again, then after this, a comparison is conducted between the wafer temperature, Tmode 1, estimated from numerical expression 3, and a measured value, Twafer, and each created model is tuned. This tuning operation is repeated a plurality of times as required.

Thus obtained is the heater output numerical model 71a that estimates the wafer temperature appropriately according to the number and layout of wafers to be treated and defines the output level for setting the wafer temperature as a target temperature. Although an example of subjecting the estimated wafer temperature to control has been shown and described, the model may instead be designed to control the observed temperature itself.

As is the case with deriving the numerical model 71a, the cooling medium supply blower 53 and the cooling medium release blower 63 are actually activated and the temperature of the semiconductor wafers is measured, while the heater 18A is operated. Thereby, the other blower output numerical model 71b can be acquired along with the heater output numerical model 71a.

While the numerical model 71 having both of the heater output numerical model 71a and the blower output numerical model 71b has also been shown and described by way of example, the heater output numerical model 71a and the blower output numerical model 71b may both be included in a numerical model 71 originally formed of a single element.

The heater output level that the heater output computing unit 51a has computed is sent to the heater driving unit 18B, which then drivingly controls the heater element 18 of the heater 18A on the basis of the heater output level computed by the heater output computing unit 51a.

Meanwhile, the blower output level that the blower output computing unit 51b has computed is sent to the inverter driving units 53a, 63a, which then drivingly control the cooling medium supply blower 53 and the cooling medium release blower 63, respectively.

In this manner, the cooling medium supply blower 53 and the cooling medium release blower 63 supply the cooling medium to the space 33 between the furnace body 5 and the treating vessel 3.

While an example of supplying the cooling medium to the space 33 between the furnace body 5 and the treating vessel 3 by providing the cooling medium supply blower 53 and the cooling medium release blower 63 has been shown and described, the cooling medium may be supplied to the space 33 between the furnace body 5 and the treating vessel 3 by providing only either one of the cooling medium supply blower 53 and the cooling medium release blower 63. In this case, a closed cooling-medium supply/release line may be formed by connecting both of the cooling medium supply line 52 and the cooling medium release line 62 to the blower. For example, if the cooling medium supply blower 53 only is provided, the inverter driving unit 53a of the cooling medium supply blower 53 will be drivingly controlled according to the blower output level computed by the blower output computing unit 51b.

Next, operation of the heat treatment apparatus having the configuration shown in FIG. 1 is described below.

First, wafers W are mounted in the boat 12 and then this boat is rested on the cylindrical heat-insulating body 11 on the lid 10. The boat 12 is later loaded into the treating vessel 3 by upward movement of the lid body 10.

Next, the controller 51 controls the heater driving unit 18B to activate each heater element 18, heat the space 33 between the furnace body 5 and the treating vessel 3, and thus conduct a necessary heat treatment upon the wafers W mounted in the boat 12 of the treating vessel 3.

During the heat treatment, as described below, the space 33 between the furnace body 5 and the treating vessel 3 is forcibly cooled when necessary, to improve efficiency of the heat treatment.

In that case, the controller 51 first activates the cooling medium supply blower 53 and the cooling medium release blower 63. A cooling medium (20 to 30° C.) is then introduced into the cooling medium supply line 52 and next carried from the cooling medium supply blower 53 to the supply duct 49.

The cooling medium in the supply duct 49 enters each ring-shaped passageway 38 formed outward with respect to the heat-insulating material 16 of the furnace body 5. Next, the cooling medium in the ring-shaped passageways 38 is blown off from the cooling medium blowoff holes 40 passed through the heat-insulating material 16, into the space 33 between the furnace body 5 and the treating vessel 3, thereby forcibly cooling the space 33.

The cooling medium in the space 33 is further carried into a heat exchanger 69 through the cooling medium release line 62, then cooled by the heat exchanger 69, and released to the outside by the cooling medium release blower 63.

In this case, the heater output computing unit 51a determines a heater output level based on the heater output numerical model 71a and the furnace internal temperature detected by the temperature sensor 50, and the heater driving unit 18B drivingly controls the heater 18A on the basis of the heater output level. In addition, the blower output computing unit 51b determines a blower output level based on the blower output numerical model 71b and the furnace internal temperature detected by the temperature sensor 50, and the inverter driving units 53a, 63a conduct driving control of the cooling medium supply blower 53 and the cooling medium release blower 63 by controlling respective rotation speeds of the blowers on the basis of the blower output level.

Thus, the internal temperature of the treating vessel 3 is settled down to the target temperature rapidly and accurately during the heating or cooling phase or stable temperature state in a low-temperature region, for example.

Second Embodiment

A second embodiment of the present invention is described below with reference to FIGS. 5 and 6.

Figure 5:
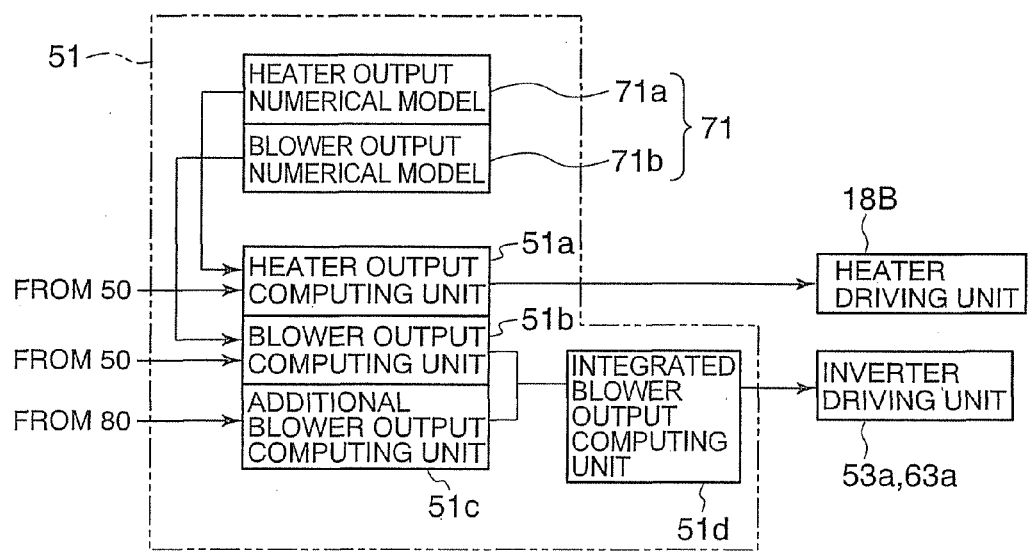
FIG. 5 is a schematic view showing a controller in a second embodiment of a heat treatment apparatus.
Figure 6:
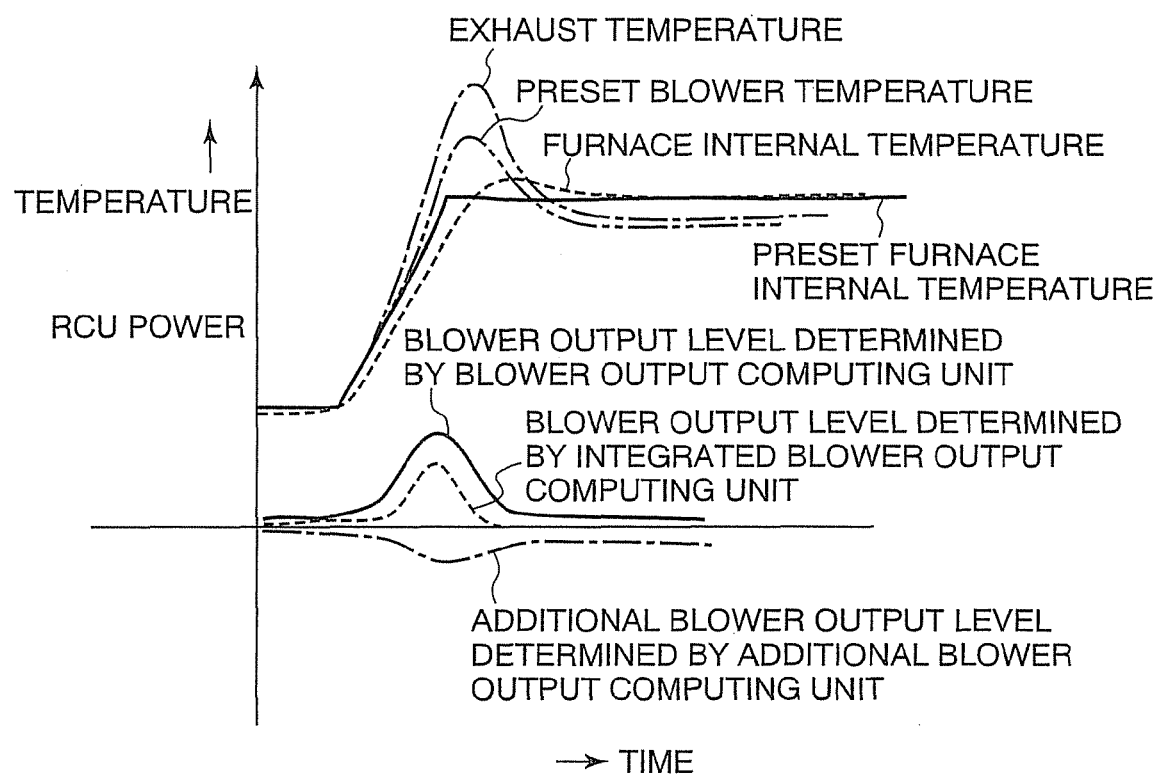
FIG. 6, is a diagram that shows control of the heat treatment apparatus according to the second embodiment.

The second embodiment shown in FIGS. 5 and 6 differs only in a configuration of a controller 51, with substantially all other configurational aspects being substantially the same as in the first embodiment of FIGS. 1 to 4.

In the second embodiment of FIGS. 5 and 6, the same elements as in the first embodiment of FIGS. 1 to 4 are each assigned the same reference number or symbol, and detailed description of these elements is omitted.

As shown in FIGS. 5 and 6, the controller 51 includes a numerical model 71 relating to predetermined heater output and blower output levels, a heater output computing unit 51a that determines a heater output level based on the numerical model 71 and a furnace internal temperature detected by a temperature sensor 50, and a blower output computing unit 51b that determines a blower output level based on the numerical model 71 and the furnace internal temperature detected by the temperature sensor 50.

The numerical model 71 includes a heater output numerical model 71a and a blower output numerical model 71b, the heater output computing unit 51a determines the heater output level based on the numerical model 71a and the furnace internal temperature detected by the temperature sensor 50, and the blower output computing unit 51b determines the blower output level based on the numerical model 71b and the furnace internal temperature detected by the temperature sensor 50.

As shown in FIG. 5, the controller 51 further includes an additional blower output computing unit 51c that determines an additional blower output level based on a preset blower temperature which follows an exhaust temperature detected by an exhaust temperature sensor 80.

The blower output level determined by the blower output computing unit 51b, and the additional blower output level determined by the additional blower output computing unit 51c are combined by an integrated blower output computing unit 51d, and on the basis of a blower output level obtained from this combination, the inverter driving units 53a, 63a drivingly control the cooling medium supply blower 53 and the cooling medium release blower 63 by controlling respective rotational speeds of the blowers.

Referring to FIGS. 5, 6, the heater output computing unit 51a determines the heater output level based on the heater output numerical model 71a and the furnace internal temperature detected by the temperature sensor 50, and the blower output computing unit 51b determines the blower output level based on the blower output numerical model 71b and the furnace internal temperature detected by the temperature sensor 50.

The additional blower output computing unit 51c determines the additional blower output level appropriate for (based on) the preset temperature following the exhaust temperature detected by the exhaust temperature sensor 80.

In this case, as shown in FIG. 6, consider, for example, raising the internal temperature of the furnace by activating a heater 18 A and an RCU system 1A, and after the furnace internal temperature has reached a certain target temperature, maintaining this target temperature for regulated internal temperature of the furnace.

In FIG. 6, in addition to the fact that the blower output computing unit 51b determines the blower output level based on the blower output numerical model 71b and the furnace internal temperature detected by the temperature sensor 50, the additional blower output computing unit 51c determines the temperature preset to follow the exhaust temperature detected by the exhaust temperature sensor 80, and then determines the additional blower output level based on the preset temperature and the exhaust temperature detected by the exhaust temperature sensor 80.

The temperature that the additional blower output computing unit 51c is to set is determined so that the temperature has an appropriate offset value for the exhaust temperature detected by the exhaust temperature sensor 80. Thus, a minus additional blower output level is always developed. In this way, when the additional blower output computing unit 51c always generates a minus additional blower output level, the blower output level derived by the integrated blower output computing unit 51d can be brought close to zero, particularly to stabilize the furnace internal temperature (i.e., to obtain temperature stability). During the stabilization of the furnace internal temperature, therefore, the furnace internal temperature can be regulated with the heater 18A only, and thus, use of the RCU system 1A can be minimized.

Third Embodiment

A third embodiment of the present invention is next described with reference to FIG. 7.

Figure 7:
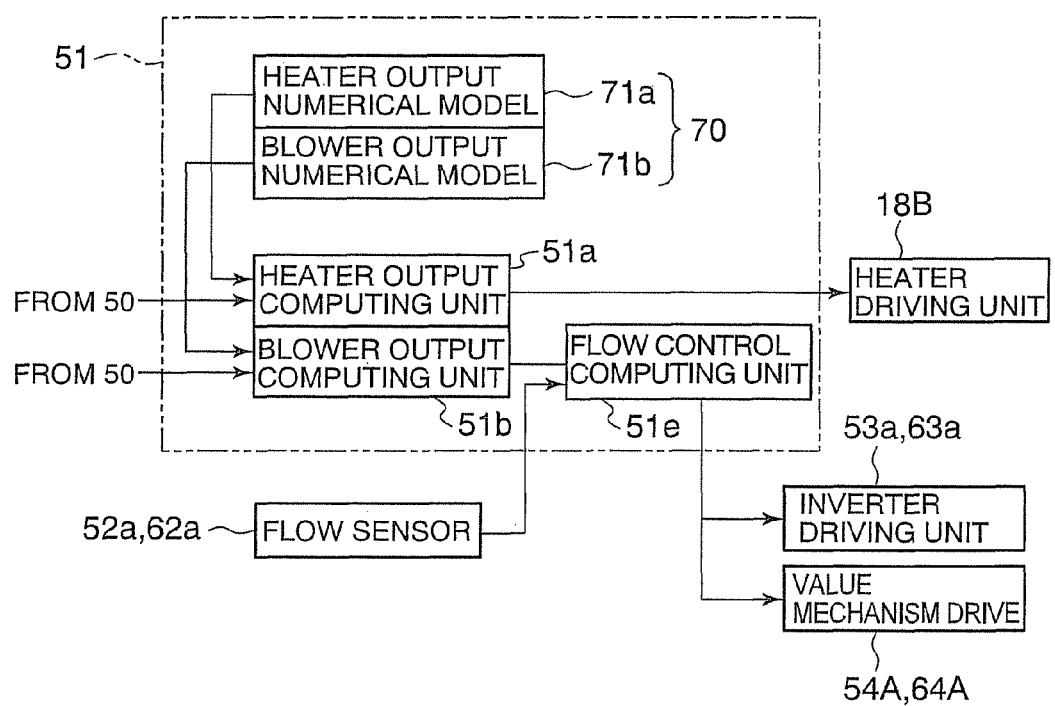
FIG. 7 is a schematic view showing a controller in a third embodiment of a heat treatment apparatus.

The third embodiment shown in FIG. 7 differs only in a configuration of a controller 51, with substantially all other configurational aspects being substantially the same as in the first embodiment of FIGS. 1 to 4.

In the third embodiment of FIG. 7, the same elements as in the first embodiment of FIGS. 1 to 4 are each assigned the same reference number or symbol, and detailed description of these elements is omitted.

As shown in FIG. 7, the controller 51 includes a numerical model 71 relating to predetermined heater output and blower output (cooling output) levels, a heater output computing unit 51a that determines a heater output level based on the numerical model 71 and a furnace internal temperature detected by a temperature sensor 50, and a blower output (cooling output) computing unit 51b that determines a blower output (cooling output) level based on the numerical model 71 and the furnace internal temperature detected by the temperature sensor 50.

The numerical model 71 includes a heater output numerical model 71a and a blower output numerical model (cooling output numerical model) 71b, the heater output computing unit 51a determines the heater output level based on the numerical model 71a and the furnace internal temperature detected by the temperature sensor 50, and the blower output computing unit 51b determines the blower output level based on the numerical model 71b and the furnace internal temperature detected by the temperature sensor 50.

The controller 51 additionally includes a flow control computing unit 51e that converts the blower output level determined by the blower output computing unit 51b, into a flow rate of a cooling medium. In this case, the flow control computing unit 51e converts the blower output level into an appropriate flow rate of the cooling medium to be supplied to a space 33 present between a furnace body 5 and a treating vessel 3.

Referring to FIG. 7, the heater output computing unit 51a determines the heater output level based on the heater output numerical model 71a and the furnace internal temperature detected by the temperature sensor 50, and the blower output computing unit 51b determines the blower output level based on the blower output numerical model 71b and the furnace internal temperature detected by the temperature sensor 50.

Furthermore, the flow control computing unit 51e converts the blower output level computed by the blower output computing unit 51b, into a flow rate of the cooling medium and then outputs inverter driving signals based on this flow rate of the cooling medium and on cooling medium flow rates in a cooling medium supply line 52 and a cooling medium release line 62, the flow rates being detected by flow sensors 52a and 62a. After that, based on the inverter driving signals computed by the flow control computing unit 51e, inverter driving units 53a and 63a conduct driving, control of a cooling medium supply blower 53 and a cooling medium release blower 63 by controlling respective rotational speeds. The cooling medium flow rates in the cooling medium supply line 52 and the cooling medium release line 62 are thus controlled.

In this way, the flow control computing unit 51e converts the blower output level computed by the blower output computing unit 51b, into the flow rate of the cooling medium to be supplied to the space 33 between the furnace body 5 and the treating vessel 3, and controls the cooling medium flow rates detected by the flow sensors 52a, 62a. Therefore, even if the cooling medium supply line 52 and cooling medium release line 62 of the heat treatment apparatus 1 according to the present embodiment differ from each other in terms of arrangement and/or shape, a desired quantity of cooling, medium can be supplied to the space 33 between the furnace body 5 and the treating vessel 3. The differences in arrangement and/or shape between the lines 52, 62, include, for example, a difference in length of the line, and more specifically, apply to the case in which either of the two lines is longer or shorter than the other.

Thus, the internal temperature of the furnace can always be controlled with high accuracy, irrespective of the arrangement and/or shape of the cooling medium supply line 52 and cooling medium release line 62 in the heat treatment apparatus 1.

The above has described an example in which the cooling medium supply blower 53 and the cooling medium release blower 63 are drivingly controlled by controlling the respective rotational speeds on the basis of the cooling medium flow rate computed by the flow control computing unit 51e. It is to be understood, however, that the example does not limit the present invention. That is, a cooling medium supply line valve mechanism 54A may instead be drivingly controlled on the basis of the cooling medium flow rate computed by the flow control computing unit 51e, and a cooling medium release line valve mechanism 64A may be drivingly controlled on the basis of the cooling medium flow rate computed by the flow control computing unit 51e. The above has also described an example in which the flow control computing unit 51e derives the cooling medium flow rate by converting the blower output level and controls the cooling medium flow rates detected by the flow sensors 52a, 62a. However, the control may be conducted using the cooling medium flow rate detected by one of the flow sensors 52a, 62a.

Fourth Embodiment

A fourth embodiment of the present invention is next described with reference to FIG. 8.

Figure 8:
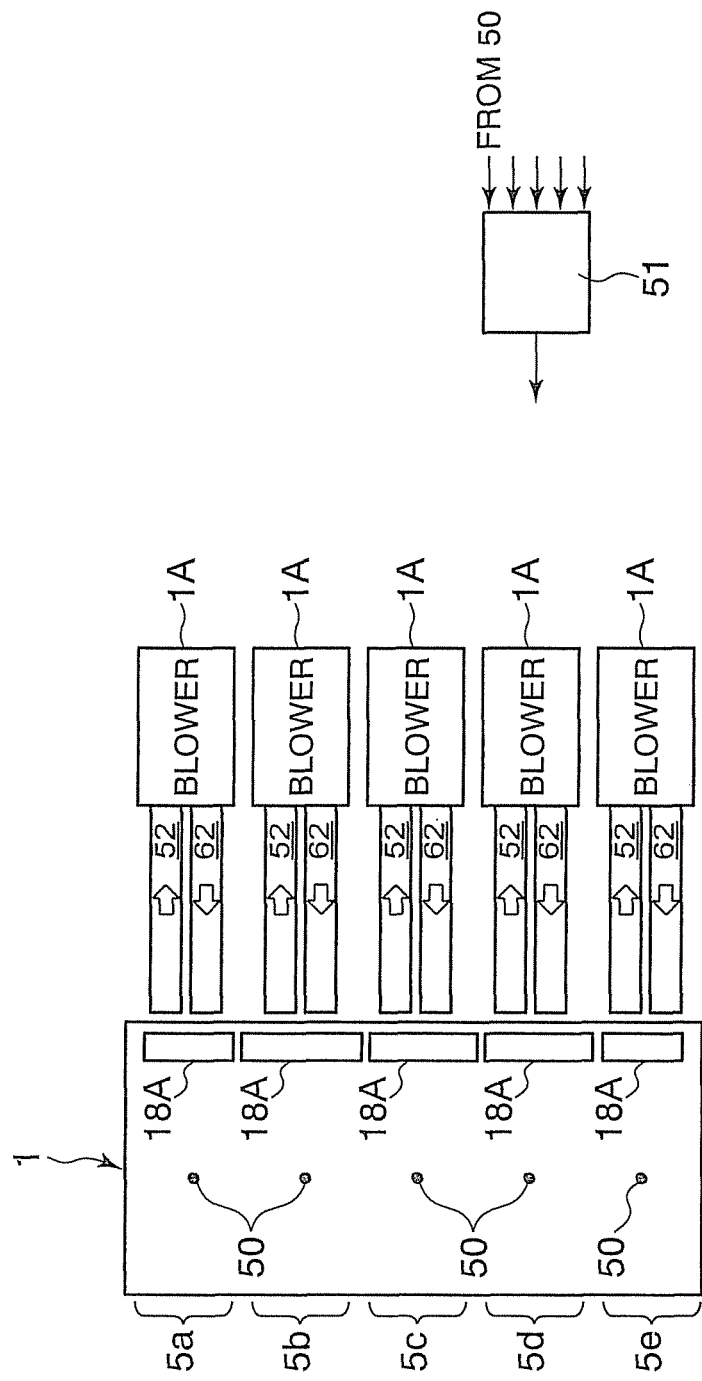
FIG. 8 is a schematic view showing a fourth, embodiment of a heat treatment apparatus.

The fourth embodiment shown in FIG. 8 includes a furnace body 5 partitioned into five zones, 5a, 5b, 5c, 5d, 5e, in that order from above downward, with a heater 18A being provided in each of the zones 5a, 5b, 5c, 5d, 5e.

In addition, RCU systems 1A each including a cooling medium supply line 52 and a cooling medium release line 62 are each connected to each zone 5a, 5b, 5c, 5d, 5e, of the furnace body 5.

Furthermore, a furnace temperature sensor 50 that detects internal temperature or external temperature of a treating vessel 3 is provided for each zone 5a, 5b, 5c, 5d, 5e, of the furnace body 5, and detection signals from the furnace temperature sensors 50 are sent to a controller 51.

The controller 51 regulates the internal temperature of the treating vessel 3 by controlling a cooling medium supply blower 53, and a cooling medium release blower 63, in addition to the heaters 18A in each zone 5a, 5b, 5c, 5d, 5e, of the furnace body 5.

Other apparatus constituent elements in the fourth embodiment of FIG. 8 are substantially the same as those of the first embodiment shown in FIGS. 1 to 4.

In the fourth embodiment of FIG. 8, the same elements as in the first embodiment of FIGS. 1 to 4 are each assigned the same reference number or symbol, and detailed description of these elements is omitted.

The controller 51 in FIG. 8 includes: numerical models 71 relating to predetermined heater output and blower output levels, the models each being for one of the zones 5a, 5b, 5c, 5d, 5e; heater output computing units 51a that each determine a heater output level in each zone 5a, 5b, 5c, 5d, 5e, based on one of the numerical models 71 and the furnace internal temperature detected by the temperature sensor 50 mounted in each zone 5a, 5b, 5c, 5d, 5e; and blower output computing units 51b that each determine a blower output level in each zone 5a, 5b, 5c, 5d, 5e, based on the corresponding numerical model 71 and the furnace internal temperature detected by the temperature sensor 50 mounted in each zone 5a, 5b, 5c, 5d, 5e.

Each numerical model 71 includes a heater output numerical model 71a and a blower output numerical model 71b, each heater output computing unit 51a determines the heater output level in each zone 5a, 5b, 5c, 5d, 5e, based on the corresponding numerical model 71a and the furnace internal temperature detected by the corresponding temperature sensor 50, and each blower output computing unit 51b determines the blower output level in each zone 5a, 5b, 5c, 5d, 5e, based on the corresponding numerical model 71b and the furnace internal temperature detected by the corresponding temperature sensor 50.

On the basis of the heater output levels thus determined for each zone 5a, 5b, 5c, 5d, 5e, the controller 51 activates heater driving units 18B to drivingly control the heaters 18A mounted in the zones 5a, 5b, 5c, 5d, 5e. The controller 51 also uses the blower output levels determined for each zone 5a, 5b, 5c, 5d, 5e to activate inverter driving units 53a, 63a to drivingly control the cooling medium supply blower 53 and the cooling medium release blower 63, in the RCU systems 1A provided for the zones 5a, 5b, 5c, 5d, 5e, by controlling respective rotating speeds of the blowers.

As described above, in the present embodiment, the inside of the furnace body 5 is partitioned into the zones, 5a, 5b, 5c, 5d, 5e and the controller 51 conducts driving control of the cooling medium supply blower 53 and cooling medium release blower 63 in the RCU systems 1A as well as of the heaters 18A in the zones 5a, 5b, 5c, 5d, 5e. As a result, internal temperatures of the treating vessel 3 in the furnace body 5 are finely controlled for each zone 5a, 5b, 5c, 5d, 5e.

What is claimed is:

1. A heat treatment apparatus comprising:
a furnace body;
a heater provided on an inner circumferential surface of the furnace body;
a treating vessel disposed inside the furnace body, the treating vessel forming a space between the furnace body and the vessel and internally accommodating a plurality of objects to be processed;
a blower, connected to the furnace body via a cooling medium supply line, for supplying a cooling medium to the space formed between the furnace body and the treating vessel;
an exhaust pipe connected to the furnace body;
a furnace temperature sensor that detects internal temperature or external temperature of the treating vessel; and
a controller that regulates the internal temperature of the treating vessel by controlling the heater and the blower in order to settle down the internal temperature of the treating vessel to a predetermined target temperature,
wherein the controller includes:
a numerical model relating to predetermined heater output and blower output levels;
a heater output computing unit hat determines a heater output level based on the numerical model and the furnace internal temperature detected by the furnace temperature sensor; and
a blower output computing unit that determines a blower output level based on the numerical model and the furnace internal temperature detected by the furnace temperature sensor;
wherein the exhaust pipe includes an exhaust temperature sensor; and
the controller further includes:
an additional blower output computing unit that determines an additional blower output level based on a difference between a preset temperature and an exhaust temperature detected by the exhaust temperature sensor; and
an integrated blower output computing unit that combines the blower output level determined by the blower output computing unit and the additional blower output level determined by the additional blower output computing unit.

2. The heat treatment apparatus according to claim 1, wherein: the numerical model includes a heater output numerical model and a blower output numerical model; the heater output computing unit determines a heater output level based on the heater output numerical model and the furnace internal temperature detected by the furnace temperature sensor; and the blower output computing unit determines a blower output level based on the blower output numerical model and the furnace internal temperature detected by the furnace temperature sensor.

3. The heat treatment apparatus according to claim 1, wherein: the controller further includes a flow control computing unit that converts the blower output level determined by the blower output computing unit, into a flow rate of the cooling medium.

4. The heat treatment apparatus according to claim 3, wherein: the flow control computing unit controls a rotating speed of the blower based on the flow rate of the cooling medium.

5. A heat treatment apparatus comprising:
a furnace body partitioned into a plurality of zones;
heaters each provided on an inner circumferential surface of each zone of the furnace body;
a treating vessel disposed inside the furnace body, the treating vessel forming a space between the furnace body and the vessel and internally accommodating a plurality of objects to be processed;
blowers, each connected to each zone of the furnace body via a cooling medium supply line, for supplying a cooling medium to the space formed between the furnace body and the treating vessel;
exhaust pipes each connected to each zone of the furnace body;
furnace temperature sensors each provided at a position associated with each zone of the furnace body, each sensor detecting internal temperature or external temperature of the treating vessel; and
a controller that regulates the internal temperature of the treating vessel by controlling the corresponding heater and blower for each zone of the furnace body in order to settle down the internal temperature of the treating vessel to a predetermined target temperature,
wherein the controller includes:
a numerical model for each zone of the furnace body, each numerical model relating to predetermined heater output and blower output levels;
a heater output computing unit that determines a heater output level for each zone, based on the numerical model corresponding to the particular zone and the furnace internal temperature detected by the corresponding furnace temperature sensor; and a blower output computing unit that determines a blower output level for each zone, based on the numerical model corresponding to the particular zone and the furnace internal temperature detected by the corresponding furnace temperature sensor;

wherein the exhaust pipe includes an exhaust temperature sensor and the controller further includes:

an additional blower output computing unit that determines an additional blower output level based on a difference between a preset temperature and an exhaust temperature detected by the exhaust temperature sensor; and an integrated blower output computing unit that combines the blower output level determined by the blower output computing unit and the additional blower output level determined by the additional blower output computing unit.

6. A heat treatment apparatus comprising:

a furnace body;

a heater provided on an inner circumferential surface of the furnace body;

a treating vessel disposed inside the furnace body, the treating vessel forming a space between the furnace body and the vessel and internally accommodating a plurality of objects to be processed;

a blower, connected to the furnace body via a cooling medium supply line, for supplying a cooling medium to the space formed between the furnace body and the treating vessel;

a valve mechanism that regulates a flow rate of the cooling medium supplied from the blower;

an exhaust pipe connected to the furnace body;

a furnace temperature sensor that detects internal temperature or external temperature of the treating vessel; and a controller that regulates the internal temperature of the treating vessel by controlling the heater and the valve mechanism in order to settle down the internal temperature of the treating vessel to a predetermined target temperature;

wherein the controller includes:

a numerical model relating to predetermined heater output and cooling output levels;

a heater output computing unit that determines a heater output level based on the numerical model and the furnace internal temperature detected by the furnace temperature sensor;

a cooling output computing unit that determines a cooling output level based on the numerical model and the furnace internal temperature detected by the furnace temperature sensor; and a flow control computing unit that converts the cooling output level determined by the cooling output computing unit, into the flow rate of the cooling medium, the flow control computing unit controlling the valve mechanism in accordance with the cooling medium flow rate;

wherein the exhaust pipe includes an exhaust temperature sensor; and the controller further includes:

an additional blower output computing unit that determines an additional blower output level based on a difference between a preset temperature and an exhaust temperature detected by the exhaust temperature sensor; and an integrated blower output computing unit that combines the blower output level determined by the blower output computing unit and the additional blower output level determined by the additional blower output computing unit.

7. The heat treatment apparatus according to claim 6, wherein: the numerical model includes a heater output numerical model and a cooling output numerical model;

the heater output computing unit determines a heater output level based on the heater output numerical model and the furnace internal temperature detected by the furnace temperature sensor; and the cooling output computing unit determines a cooling output level based on the cooling output numerical model and the furnace internal temperature detected by the furnace temperature sensor.

8. A heat treatment apparatus comprising:

a furnace body partitioned into a plurality of zones;

heaters each provided on an inner circumferential surface of each zone of the furnace body;

a treating vessel disposed inside the furnace body, the treating vessel forming a space between the furnace body and the vessel and internally accommodating a plurality of objects to be processed;

blowers, each connected to each zone of the furnace body via a cooling medium supply line, for supplying a cooling medium to the space formed between the furnace body and the treating vessel;

a valve mechanism that regulates a flow rate of the cooling medium supplied from each blower;

exhaust pipes each connected to each zone of the furnace body;

furnace temperature sensors each provided at a position associated with each zone of the furnace body, each sensor detecting internal temperature or external temperature of the treating vessel; and a controller that regulates the internal temperature of the treating vessel by controlling the corresponding heater and valve mechanism for each zone of the furnace in order to settle down the internal temperature of the treating vessel to a predetermined target temperature, wherein the controller includes:

a numerical model for each zone of the furnace body, each numerical model relating to predetermined heater output and cooling output levels;

a heater output computing unit that determines a heater output level for each zone, based on the numerical model corresponding to the particular zone and the furnace internal temperature detected by the corresponding furnace temperature sensor;

a cooling output computing unit that determines a cooling output level for each zone, based on the numerical model corresponding to the particular zone and the furnace internal temperature detected by the corresponding furnace temperature sensor; and a flow control computing unit that converts the cooling output level determined by the cooling output computing unit for each zone, into the flow rate of the cooling medium, the flow control computing unit controlling the valve mechanism corresponding to the particular zone in accordance with the cooling medium flow rate;

wherein the exhaust pipe includes an exhaust temperature sensor; and the controller further includes:

an additional blower output computing unit that determines an additional blower output level based on a difference between a preset temperature and an exhaust temperature detected by the exhaust temperature sensor; and an integrated blower output computing unit that combines the blower output level determined by the blower output computing unit and the additional blower output level determined by the additional blower output computing unit.

* * * * *